(12) United States Patent
Tung

(10) Patent No.: US 6,262,459 B1
(45) Date of Patent: Jul. 17, 2001

(54) HIGH-VOLTAGE DEVICE AND METHOD FOR MANUFACTURING HIGH-VOLTAGE DEVICE

(75) Inventor: Ming-Tsung Tung, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/484,489

(22) Filed: Jan. 18, 2000

(51) Int. Cl.$^7$ .......................... H01L 29/76; H01L 29/94; H01L 31/062; H01L 31/113; H01L 31/119
(52) U.S. Cl. .......................... 257/389; 257/344; 257/397; 257/398; 257/399; 257/408
(58) Field of Search .................................. 257/344, 389, 257/395, 396, 397, 398, 399, 400, 408

(56) References Cited

U.S. PATENT DOCUMENTS

| | | | |
|---|---|---|---|
| 5,047,358 | * | 9/1991 | Kosiak et al. . |
| 5,585,660 | * | 12/1996 | Mei ........................................ 257/389 |
| 5,670,816 | * | 9/1997 | Hatano et al. ........................ 257/394 |
| 5,869,875 | * | 2/1999 | Hebert .................................. 257/382 |
| 6,160,289 | * | 12/2000 | Kwon et al. ......................... 257/335 |

* cited by examiner

Primary Examiner—Ngân V. Ngô

(57) ABSTRACT

A high-voltage device. A first well region with a first conductive type is located in a substrate. A second well region with the second conductive type is located in the substrate but is isolated from the first well region. Several field oxide layers are located on a surface of the second well region. A shallow trench isolation is located between the field oxide layers in the second well region. A first doped region with the second conductive type is located beneath the field oxide layers. A second doped region with the first conductive type is located beneath the shallow trench isolation in the second well region. A third well region with the first conductive type is located in the first well region and expands from a surface of the first well region into the first well region. A gate structure is positioned on the substrate between the first and the second well regions and covers a portion of the first, the third well regions and the field oxide layers. A source region with the second conductive type and a drain region with the second conductive type are respectively located in the third and the second well regions exposed by the gate structure and the field oxide layers.

9 Claims, 3 Drawing Sheets

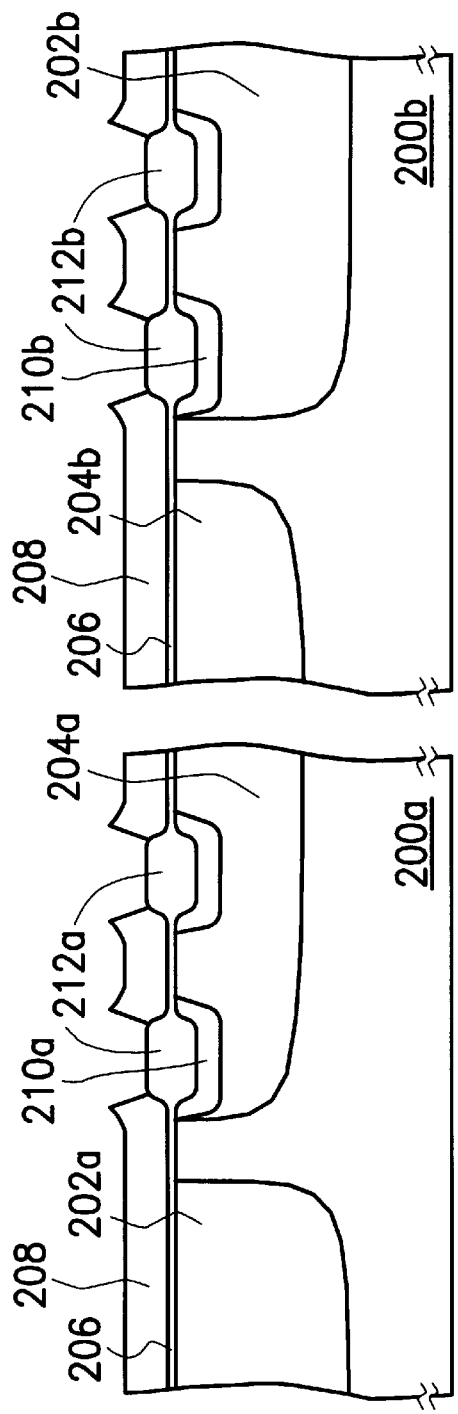
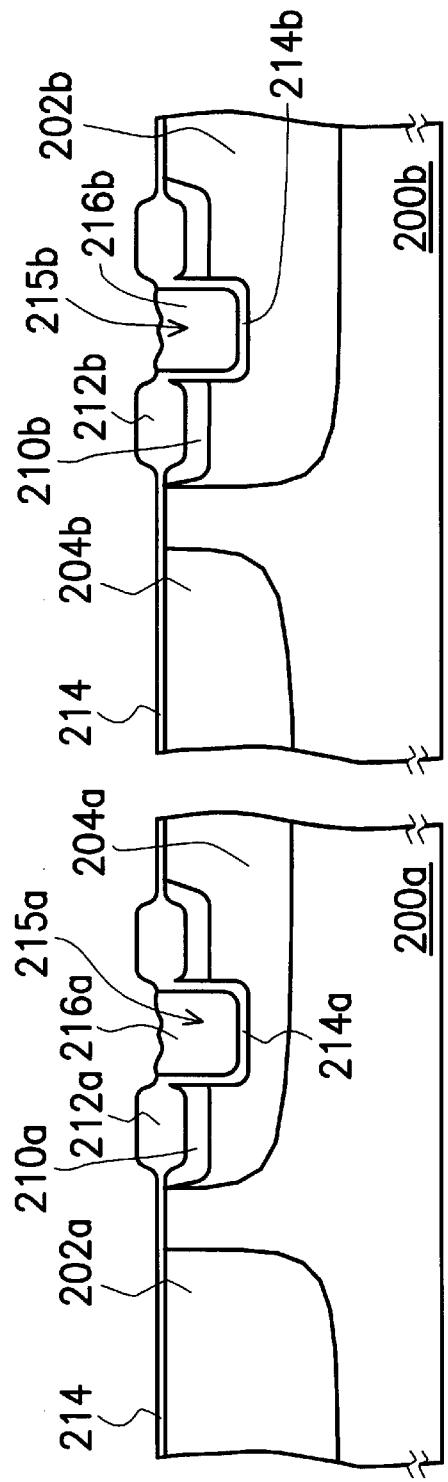
FIG. 2A
FIG. 2B

US 6,262,459 B1

HIGH-VOLTAGE DEVICE AND METHOD FOR MANUFACTURING HIGH-VOLTAGE DEVICE

BACKGROUND OF THE INVENTION

1. Field of Invention

The present invention relates to a semiconductor and a method for manufacturing a semiconductor. More particularly, the present invention relates to a high-voltage device and a method for manufacturing a high-voltage device.

2. Description of Related Art

A high voltage device is one of the most important devices utilized in a highly integrated circuit. Erasable programmable read only memory (EPROM) and flash memory are two of the high-voltage devices most often used in computers and electronic products.

Due to the increasing number of semiconductor devices incorporated in integrated circuits, the size of transistors needs to be decreased. Accordingly, as the channel length of the transistors is decreased, the operating speed is increased. However, the short channel effect caused by the reduced channel length is becoming serious. If the voltage level is fixed as the channel length is shortened, the strength of the electrical field is increased according to the equation, electrical field=electrical voltage/channel length. Thus, as the strength of the electrical field increases, the energy of electrons increases and electrical breakdown is likely to occur.

In the conventional high-voltage device, the formation of an isolation layer is used for the purpose of increasing the channel length. Hence, the high-voltage device is able to work normally at a high electrical voltage.

FIG. 1 is a schematic, cross-sectional view of a conventional high-voltage device. As shown in FIG. 1, a field oxide layer 102 is located on a P-type substrate 100. A gate oxide layer 103 is located on the P-type silicon substrate 100. A gate electrode 104 is located on the field oxide layer 102 and the gate oxide layer 103. A source region 106 and a drain region 108 are located in the P-type substrate 100. An $N^-$-type doped region 112 is located in the substrate beneath the drain region 108, the field oxide layer 102 and a portion of the gate electrode 104. A P-type doped region 114 is located under the source region 106 and a portion of the gate electrode 104.

In order to increase the breakdown voltage of the high-voltage device, it is necessary to decrease the dopant concentration of the drift region, which is the dopant concentration of the $N^-$-type doped region 112. However, the current-driving performance and the channel conductivity between the source region 106 and the drain region 108 under the gate electrode 104 in the substrate 100 are decreased.

Additionally, when the manufacturing technique is promoted to a sub-quarter micron level, for example, a line width of 0.18 microns or less, it is difficult to decrease the typical design rule of the high-voltage device.

SUMMARY OF THE INVENTION

The invention provides a high-voltage device constructed on a substrate. The high-voltage device comprise a first well region with the first conductive type, a second well region with a second conductive type, several field oxide layers, several first doped regions with the second conductive type, a shallow trench isolation, a second doped region with the first conductive type, a third well region with the first conductive type, a gate structure, a source region with the second conductive type and a drain region with the second conductive type. The first well region is located in the substrate and the second well region is also located in the substrate but isolated from the first well region. Several field oxide layers are located on a surface of the second well region. One of the field oxide layers is positioned on the margin of the second well region near the first well region. The shallow trench isolation is located between the field oxide layers in the second well region. The first doped regions are located beneath the field oxide layers. The second doped region is located beneath the shallow trench isolation in the second well region. The third well region is located in the first well region and expands from a surface of the first well region into the first well region. The gate structure is positioned on the substrate between the first and the second well regions and covers a portion of the first, the third well regions and the field oxide layers. The source region the drain region are relatively located in the first and the second well regions exposed by the gate structure and the field oxide layers.

The invention also provides a method for forming a high-voltage device. A substrate. A first well region with the first conductive type is formed in the substrate. A second well region with a second conductive type is formed in the substrate. A pad oxide layer and a patterned silicon nitride layer are formed on the substrate in sequence. Several first doped regions with the second conductive type are formed in the second well region under portions of the pad oxide layer exposed by the patterned silicon nitride layer. Several field oxide layers are formed on the portions of the pad oxide layer above the first doped regions. The patterned silicon nitride layer and the pad oxide layer are removed. A shallow trench isolation is formed in the second well region between the field oxide layers. A third well region with the first conductive type is formed in the first well region while a second doped region with the first conductive type is formed in the second well region beneath the shallow trench isolation. A gate structure is formed on the substrate between the first and second well regions and laterally expands to cover a portion of the first and the third well regions and the field oxide layer. A source with the second conductive type and a drain with the second conductive type are respectively formed in the third well region and the second well region exposed by the gate structure and the field oxide layer.

In the method described above, when the first conductive type is N-type, the second conductive type is P-type. Simultaneously, when the first conductive type is P-type, the second conductive type is N-type. Incidentally, a dosage of the third well region is higher than that of the first well region.

In the invention, around the source region, the first well region contains the third well region. Since the dosage of the third well region is higher than that of the first well region, the depletion region existing between the first and the third well regions is relatively small. According to the equation of electrical field=electrical voltage/channel length, the relatively small depletion region possesses a relatively high electric field. Hence, the conductivity and the electric-field intensity of the high-voltage device are increased. Therefore, the current-driving performance is increased.

Moreover, around the drain region, a depletion region exists between the second doped region and the second well region. Furthermore, the dosage of the second well region is lower than that of the conventional $N^-$-type doped region 112. Therefore, it can provide a bulk breakdown around the drain region.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIGS. 2A through 2D are schematic, cross-sectional views of the process for manufacturing a high-voltage device in a preferred embodiment according to the invention.

DESCRIPTION OF THE PREFERRED EMBODIMENTS

FIGS. 2A through 2D are schematic, cross-sectional views of the process for manufacturing a high-voltage device in a preferred embodiment according to the invention.

As shown in FIG. 2A, substrates 200a and 200b are provided. An ion implantation process is performed to form well regions 202a and 202b with a first conductive type respectively in the substrate 200a and the substrate 200b. Each dosage of the well regions 202a and 202b is about $1 \times 10^{12} - 1 \times 10^{13}$ atoms/cm².

Figure 1:
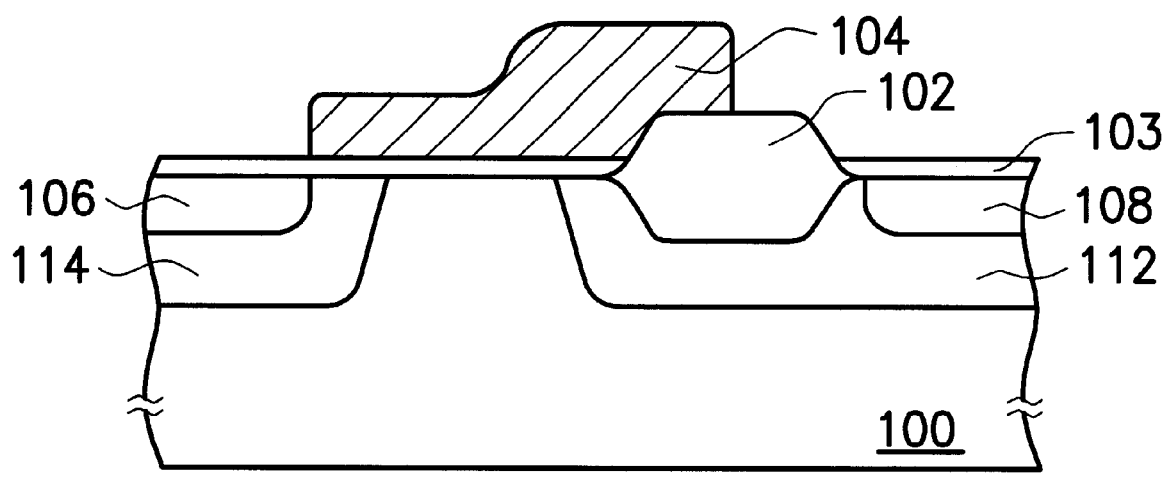
FIG. 1 is a schematic, cross-sectional view of a conventional high-voltage device.

An ion implantation is performed to form well regions 204a and 204b with a second conductive type respectively in the substrate 200a and the substrate 200b. The dosages of the well regions 204a and 204b are each about $1 \times 10^{12} - 1 \times 10^{13}$ atoms/cm². The dosages of the well regions 204a and 202b are lower than that of the conventional N⁻-type doped region 112 (as shown in FIG. 1). Thereafter, a drive-in process is performed. A pad oxide layer 206 and a patterned silicon nitride layer 208 are formed in sequence over the substrates 200a and 200b. The patterned silicon nitride layer 208 exposes portions of the pad oxide layer 206 above the well regions 204a and 202b. The exposed portions of the pad oxide layer 206 are used to form field oxide layer in the subsequent process.

A doped region 210a with the second conductive type and a doped region 210b with the first conductive type are respectively formed in the well regions 204a and 202b under the exposed portions of the pad oxide layer 206. The dosages of the doped regions 210a and 210b are each about $1 \times 10^{12} - 1 \times 10^{14}$ atoms/cm². Field oxide layers 212a and 212b are respectively formed on the doped regions 210a and 210b. One of the field oxide layers 212a is located over the well region 204a and near the margin of the well region 202a. Moreover, one of the field oxide layers 210b is located over the well region 202b and near the margin of the well region 204b.

As shown in FIG. 2B, the patterned silicon nitride layer 208 and the pad oxide layer 206 are removed in sequence. Trenches 215a and 215b are respectively formed in the substrate 200a between the field oxide layers 210a and in the substrate 200b between the field oxide layers 210b. An oxide layer 214 is formed over the substrates 200a and 200b. Portions of the oxide layer 214 respectively located in the trenches 215a and 215b are respectively denoted as linear layers 214a and 214b. The method for forming the oxide layer 214 can be thermal oxidation and the thickness of the oxide layer 214 is about 100–500 angstroms.

Oxide layers 216a and 216b are formed in the trenches 215a and 215b and fill the trenches 215a and 215b. The oxide layers 216a and 216b are used as shallow trench isolations. The method in the formation of the shallow trench isolations 216a and 216b comprises the steps of forming an oxide layer (not shown) on the oxide layer 214 with a thickness of about 5000–9000 angstroms by atmospheric pressure chemical vapor deposition (APCVD), and then performing a densification process to reinforce the compactness of the oxide layer in the trenches 215a and 215b. The densification process is performed at a temperature of about 1000 centigrade for 10–30 minutes. A chemical-mechanical polishing (CMP) is performed to remove a portion of the oxide layer, thereby to expose the surface of the oxide layer 214 and to form the oxide layers 216a and 216b.

Figure 2C:
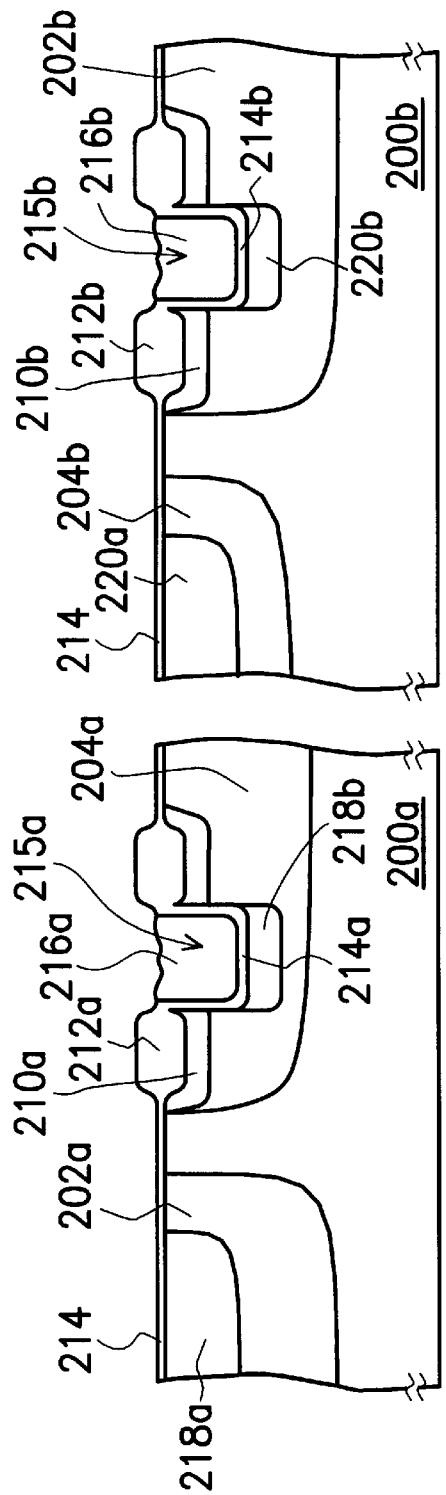

As shown in FIG. 2C, a well region 218a with the first conductive type is formed in the well region 202a while a doped region 218b with the first conductive type is formed in the well region 204a under the shallow trench isolation 216a. The dosages of the well region 218a and the doped region 218b are each about $1 \times 10^{13} - 1 \times 10^{14}$ atoms/cm². Additionally, the well region 218a expands from the surface of the well region 202a into the well region 202a and merges with a portion of the well region 202a. In the invention, the dosage of the doped region 218a is higher than that of the well region 202a.

A well region 220a with the second conductive type is formed in the well region 204b while a doped region 220b with the second conductive type is formed in the well region 202b under the shallow trench isolation 216b. The dosages of the well region 220a and doped region 220b are each about $1 \times 10^{13} - 1 \times 10^{14}$ atoms/cm². Additionally, the well region 220a expands from the surface of the well region 204b into the well region 204b and merges with a portion of the well region 204b. In the invention, the dosage of the doped region 220a is higher than that of the well region 204b.

Figure 2D:
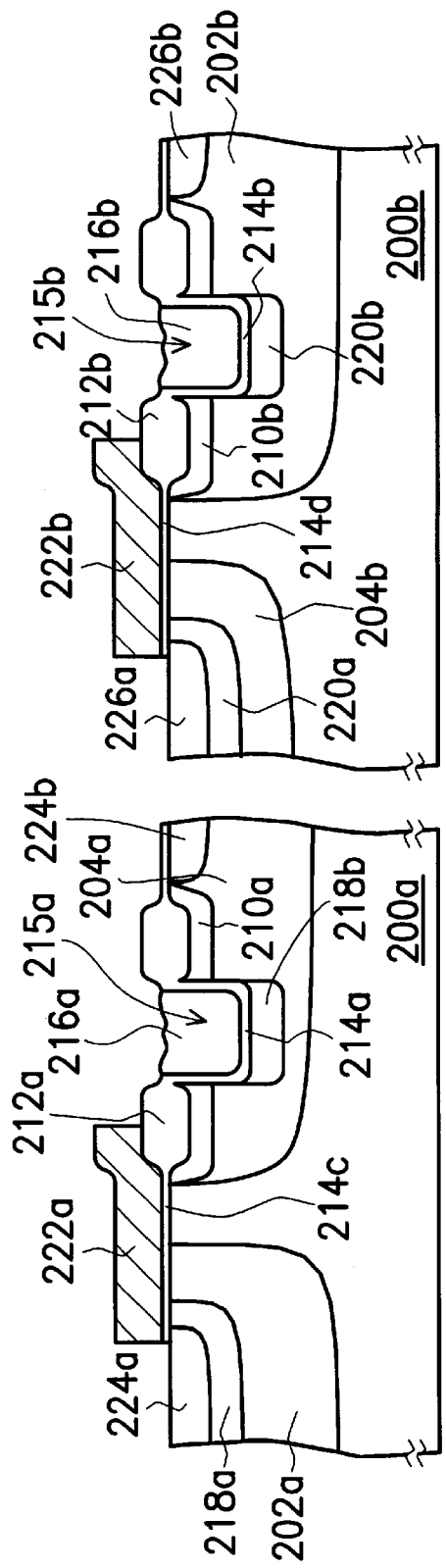

As shown in FIG. 2D, an oxide layer (not shown) and a conductive layer (not shown) are formed over the substrates 200a and 200b. The conductive layer, the oxide layer and the oxide layer 214 layer are patterned to form a gate electrode 222a and a gate oxide layer 214c on the substrate 200a and to form a gate electrode 222b and a gate oxide layer 214d on the substrate 200b. The patterned conductive layer is transformed into the gate electrodes 222a and 222b and the patterned oxide layer and the patterned oxide layer 214 together form the gate oxide layers 214c and 214d. The gate structure constructed by the gate electrode 222a and the gate oxide layer 214c is located on the substrate 200a between the well regions 202a and 204a and laterally expands over portions of the well regions 202a, 218a and the field oxide layer 212a. The gate structure constructed by the gate electrode 222b and the gate oxide layer 214d are located on the substrate 200b between the well regions 202b and 204b and laterally expands over portions of the well regions 204b, 220a and the field oxide layer 212b.

A source region 224a with the second conductive type and a drain region 224b with the second conductive type are respectively formed in the well regions 218a and 204a exposed by the gate structure and the field oxide layer 212a. The dosages of the source region 224a and the drain region 224b are each about $1 \times 10^{15}$ atoms/cm² – $1 \times 10^{16}$ atoms/cm².

Each dosage of the source region 224a and the drain region 224b is higher than those of the well regions 202a and 204a.

A source region 226a with the first conductive type and a drain region 226b with the first conductive type are respectively formed in the well regions 220a and 202b exposed by the gate structure and the field oxide layer 212b. Therefore, the manufacturing process for forming the high-voltage device is finished. The dosages of the source region 226a and the drain region 226b are each about $1\times10^{15}$ atoms/cm$^2$–$1\times10^{16}$ atoms/cm$^2$. Each dosage of the source region 226a and the drain region 226b is higher than those of the well regions 202b and 204b.

Notably, when the first conductive type is N-type, the second conductive type is P-type. Simultaneously, when the first conductive type is P-type, the second conductive type is N-type. The method according to the invention not only can be applied in the formation of a single-type MOS, such as NMOS or PMOS, but also can be applied in the formation of a complementary metal-oxide semiconductor (CMOS).

In the invention, the well region 202a with the first conductive type and the well region 204a with the second conductive type isolated from the well region 202a are located in the substrate 200a. Several field oxide layers 212a are located on the surface of the well region 204a and one of the field oxide layer 212a is positioned on the margin of the well region 204a near the well region 202a. The shallow trench isolation 216a is located between the field oxide layers 212a in the well region 204a. The doped region 210a with the second conductive type is located beneath the field oxide layers 210a and the doped region 218b with the first conductive type is located beneath the shallow trench isolation 216a in the well region 204a. The well region 218a with the first conductive type located in the well region 202a expands from the surface of the well region 202a into the well region 202a. The gate structure is positioned on the substrate 200a between the well regions 202a and 204a and covers over a portion of the well regions 202a, 218a and the field oxide layer 212a. Additionally, the source region 224a with the second conductive type and the drain region 224b with the second conductive type are respectively located in the well regions 218a and 204a exposed by the gate structure and the field oxide layer 212a.

Around the source regions 224a and 226a, the well regions 202a and 204b respectively contain the well regions 218a and 220a. Since the dosage of the well region 218a is larger than that of the well region 202a and the dosage of the well region 220a is larger than that of the well region 204b, the depletion regions existing respectively between the well regions 202a and 218a and between the well regions 204b and 220a are relatively small. According to the equation, electrical field=electrical voltage/channel length, the relatively small depletion region possesses a relatively high electric field. Hence, the conductivity and the electric-field intensity of the high-voltage device are increased. Therefore, the current-driving performance is increased.

Moreover, around the drain regions 224b and 226b, the depletion regions respectively exist between the doped region 218b and the well region 204a and between the doped region 220b and the well region 202b. Furthermore, each dosage of the well regions 204a and 202b is lower than that of the conventional N$^-$-type doped region 112. Therefore, it can provide a bulk breakdown around the drain regions 224b and 226b.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A high-voltage device constructed on a substrate, the high-voltage device comprising:

a first well region with a first conductive type located in the substrate;

a second well region with the second conductive type located in the substrate and isolated from the first well region;

a plurality of field oxide layers located on a surface of the second well region;

a shallow trench isolation located between the field oxide layers in the second well region;

a first doped region with the second conductive type located beneath the field oxide layers;

a second doped region with the first conductive type located beneath the shallow trench isolation in the second well region;

a third well region with the first conductive type located in the first well region, wherein the third well region expands from a surface of the first well region into the first well region;

a gate structure positioned on the substrate between the first and the second well regions, wherein the gate structure covers a portion of the first, the third well regions and the field oxide layers;

a source region with the second conductive type located in the third well region exposed by the gate structure; and a drain region with the second conductive type located in the second well region exposed by the gate structure and the field oxide layers.

2. The high-voltage device of claim 1, wherein when the first conductive type is N-type, the second conductive type is P-type.

3. The high-voltage device of claim 1, wherein when the first conductive type is P-type, the second conductive type is N-type.

4. The high-voltage device of claim 1, wherein a dosage of the first well region is about $1\times10^{12}$–$1\times10^{13}$ atoms/cm$^2$.

5. The high-voltage device of claim 1, wherein a dosage of the second well region is about $1\times10^{12}$–$1\times10^{13}$ atoms/cm$^2$.

6. The high-voltage device of claim 1, wherein a dosage of the third well region is about $1\times10^{13}$–$1\times10^{14}$ atoms/cm$^2$.

7. The high-voltage device of claim 1, wherein a dosage of the third well region is higher than that of the first well region.

8. The high-voltage device of claim 1, wherein a dosage of the first doped region is about $1\times10^{12}$–$1\times10^{14}$ atoms/cm$^2$.

9. The high-voltage device of claim 1, wherein a dosage of the second doped region is about $1\times10^{13}$–$1\times10^{14}$ atoms/cm$^2$.

* * * * *